(12) United States Patent
Kodama et al.

(10) Patent No.: US 12,461,212 B2
(45) Date of Patent: Nov. 4, 2025

(54) SUBSTRATE PROCESSING SYSTEM AND METHOD OF ESTIMATING HEIGHT OF ANNULAR MEMBER

(71) Applicant: Tokyo Electron Limited, Tokyo (JP)

(72) Inventors: Toshiaki Kodama, Nirasaki (JP); Shinji Wakabayashi, Nirasaki (JP); Takehiro Shindo, Nirasaki (JP); Tatsuru Okamura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 860 days.

(21) Appl. No.: 17/661,302

(22) Filed: Apr. 29, 2022

(65) Prior Publication Data

US 2022/0365187 A1 Nov. 17, 2022

(30) Foreign Application Priority Data

May 11, 2021 (JP) .................. 2021-080547

(51) Int. Cl.
*G01S 7/497* (2006.01)
*G01S 17/08* (2006.01)
(Continued)

(52) U.S. Cl.
CPC .............. *G01S 7/497* (2013.01); *G01S 17/08* (2013.01); *G01S 17/88* (2013.01);
(Continued)

(58) Field of Classification Search
CPC .......... G01S 7/497; G01S 17/08; G01S 17/88; G01S 17/36; G01S 17/87; H01J 37/32642; H01J 2237/24578; H01J 2237/24592; H01J 37/32807; H01J 37/32743; G01B 11/0608; H01L 21/68721; H01L 21/67739; H01L 21/67259; H01L 21/67069; H01L 21/67248; H01L 21/67288; H01L 21/67742; H01L 21/681; H01L 21/68735
(Continued)

(56) References Cited

U.S. PATENT DOCUMENTS 9,043,020 B2 * 5/2015 Kodama ................ B25J 9/1664
700/245

FOREIGN PATENT DOCUMENTS

| JP | 2001-230239 A | 8/2001 |
| JP | 2006-088306 A | 4/2006 |

(Continued)

*Primary Examiner* — Daniel L Murphy
(74) *Attorney, Agent, or Firm* — Armstrong Teasdale LLP

(57) ABSTRACT

A substrate processing system includes: a substrate processing apparatus including a stage on which a substrate and an annular member are placed; a substrate transport mechanism including a substrate holder; a distance sensor provided in the substrate holder; and a control device, wherein the substrate transport mechanism is configured to place a jig substrate having a reference surface as a reference for a height of the annular member on the stage, wherein the distance sensor is configured to measure a distance from the substrate holder positioned above the stage to the reference surface of the jig substrate and a distance from the substrate holder to the annular member, and wherein the control device is configured to estimate the height of the annular member based on a measurement result of the distance to the reference surface and a measurement result of the distance to the annular member.

11 Claims, 16 Drawing Sheets

(51) Int. Cl.
*G01S 17/88* (2006.01)
*H01J 37/32* (2006.01)

(52) U.S. Cl.
CPC ................... *H01J 37/32642* (2013.01); *H01J 2237/24578* (2013.01); *H01J 2237/24592* (2013.01)

(58) Field of Classification Search
USPC ........................................................ 356/4.01
See application file for complete search history.

(56) References Cited

FOREIGN PATENT DOCUMENTS

| | | |
|---|---|---|
| JP | 2017-050535 A | 3/2017 |
| KR | 10-2017-0022907 A | 3/2017 |

\* cited by examiner

SUBSTRATE PROCESSING SYSTEM AND METHOD OF ESTIMATING HEIGHT OF ANNULAR MEMBER

CROSS-REFERENCE TO RELATED APPLICATION

This application is based upon and claims the benefit of priority from Japanese Patent Application No. 2021-080547, filed on May 11, 2021, the entire contents of which are incorporated herein by reference.

TECHNICAL FIELD

The present disclosure relates to a substrate processing system and a method of estimating a height of an annular member.

BACKGROUND

Patent Document 1 discloses a technique for detecting wear of consumable components in a semiconductor manufacturing apparatus. A chamber disclosed in Patent Document 1 is a chamber configured to process a substrate, and includes a reference component, a consumable component, a transport arm, a sensor, and a controller. The reference component does not wear during an operation of the chamber and the consumable component wears during the operation of the chamber. The transport arm is configured to transfer a substrate into the chamber. The sensor is configured to measure a first distance from the sensor to a surface of the consumable component when the transport arm moves over the consumable component, and to measure a second distance from the sensor to a surface of the reference component when the transport arm moves over the reference component. The controller is configured to determine an amount of wear of the consumable component based on the first distance and the second distance. In Patent Document 1, the reference component is a chuck that holds the substrate.

PRIOR ART DOCUMENT

Patent Document

Patent Document 1: Japanese Laid-Open Patent Publication No. 2017-50535

SUMMARY

According to an aspect of the present disclosure, there is provided a substrate processing system including: a substrate processing apparatus including a stage on which a substrate and an annular member disposed to surround the substrate are placed, and configured to perform a predetermined process on the substrate placed on the stage; a substrate transport mechanism including a substrate holder and configured to hold the substrate by the substrate holder and load and unload the substrate with respect to the substrate processing apparatus; a distance sensor provided in the substrate holder and configured to measure distances from the substrate holder; and a control device, wherein the substrate transport mechanism is further configured to place, on the stage on which the annular member is placed, a jig substrate having a reference surface as a reference for a height of the annular member, wherein the distance sensor is further configured to measure a distance from the substrate holder positioned above the stage to the reference surface of the jig substrate and a distance from the substrate holder to the annular member, and wherein the control device is configured to estimate the height of the annular member based on a measurement result of the distance to the reference surface and a measurement result of the distance to the annular member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
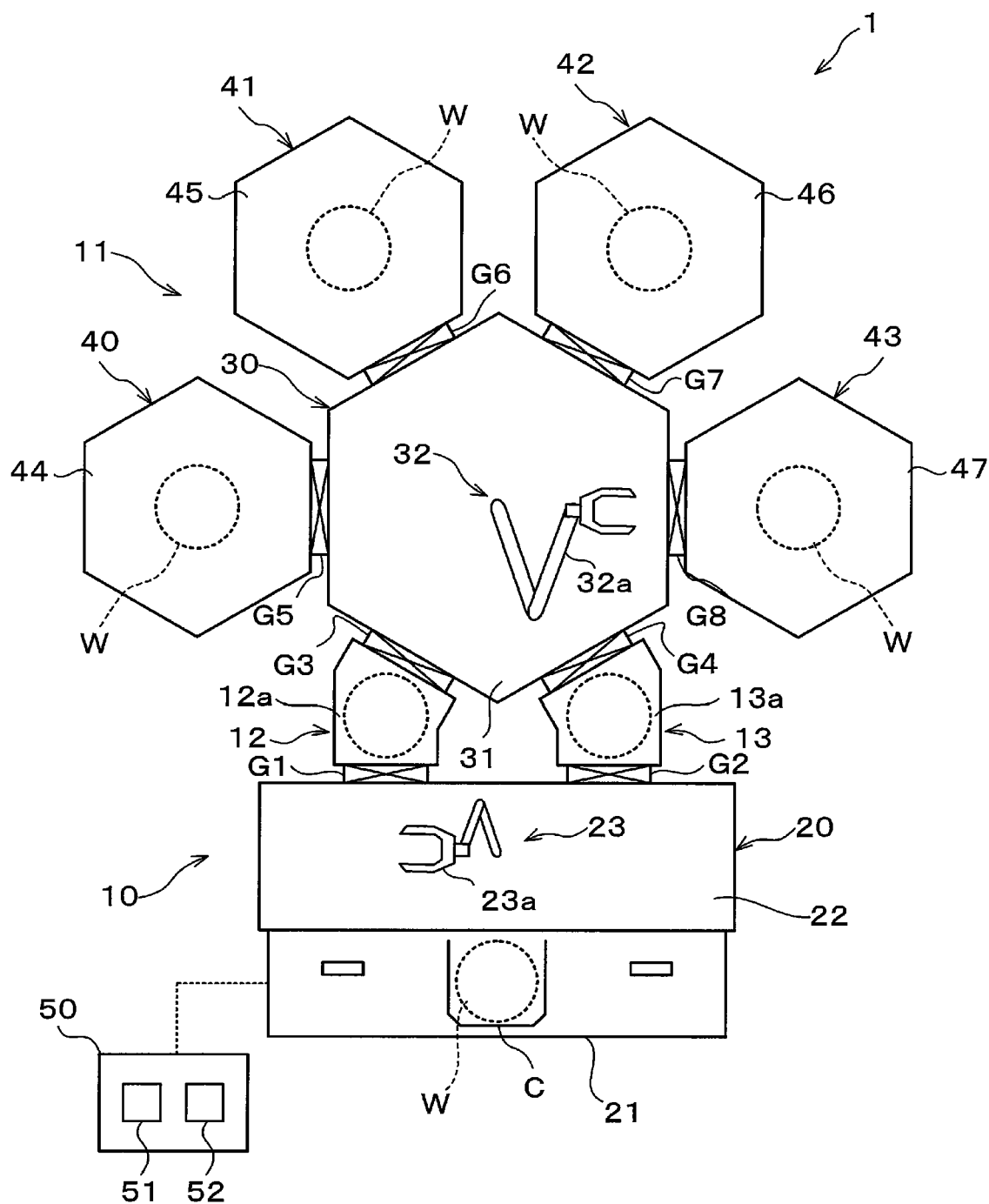
FIG. 1 is a plan view illustrating an outline of a configuration of a wafer processing system as a substrate processing system according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

For example, in a process of manufacturing a semiconductor device or the like, a predetermined process, such as an etching process, is performed on a substrate, such as a semiconductor wafer (hereinafter, referred to as a "wafer"), by using plasma by a substrate processing apparatus. The process using plasma, that is, a plasma process, is performed in a state in which the substrate is placed on a stage in a depressurized processing container.

In addition to the substrate, an annular member such as a focus ring or a cover ring is placed on the above-mentioned stage. The focus ring is an annular member disposed adjacent to the substrate on the stage, and the cover ring is an annular member disposed to cover an outer surface of the focus ring. The focus ring or the cove ring is etched and consumed by being exposed to the plasma. When the focus ring or covering is consumed, a proper plasma process result may not be obtained. Specifically, for example, when the focus ring is consumed, a shape of a plasma sheath may change, and as a result, an appropriate plasma process result may not be obtained.

Therefore, a height of the annular member such as the focus ring placed on the stage is measured or estimated by using a sensor, and conventionally, the height of the annular member (in other words, a degree of wear of the annular member) is estimated from the measurement results or the estimation results. For example, the amount of wear of the focus ring is determined based on a measured distance from a sensor provided on a transport arm of a substrate transport apparatus, which transports the substrate to the processing container, to a surface of the focus ring, and a measured distance from the sensor to a surface of the stage (see Patent Document 1).

However, when the height of the annular member such as the focus ring is estimated based on the distance from the sensor to the surface of the stage (specifically, a substrate placement surface on which the substrate is placed), it may not be possible to accurately estimate the height of the focus ring. For example, the surface of the stage may be intentionally provided with unevenness, and in this case, the estimation result of the height of the annular member varies depending on to which portion of an uneven surface forming the unevenness on the surface of the stage is measured by the sensor as the distance. However, when the unevenness is small or the like, it is difficult to select to which portion of the uneven surface on the placement surface is measured by the sensor as the distance.

Therefore, the technique according to the present disclosure accurately estimates a height of an annular member placed on a stage.

Hereinafter, a substrate processing system and a method of estimating a height of an annular member according to the present embodiment will be described with reference to the drawings. In the specification and drawings, elements having substantially the same functional configurations will be denoted by the same reference numerals and redundant descriptions will be omitted.

Wafer Processing System

FIG. 1 is a plan view schematically illustrating an outline of a configuration of a wafer processing system 1 as a substrate processing system according to an embodiment.

The wafer processing system 1 of FIG. 1 performs a predetermined process, such as an etching process, on a wafer W as a substrate by using plasma under a reduced pressure.

The wafer processing system 1 has a configuration in which a carrier station 10, with respect to which a carrier C capable of accommodating a plurality of wafers W is loaded and unloaded, and a processing station 11 including a plurality of various processing modules, each of which is configured to perform a predetermined process on the wafer W under a reduced pressure, are integrally connected to each other. The carrier station 10 and the processing station 11 are connected via two load-lock apparatuses 12 and 13.

The load-lock apparatuses 12 and 13 have load-lock chambers 12a and 13a, respectively, configured to switch the interiors thereof between an atmospheric pressure state and a vacuum state. The load-lock apparatuses 12 and 13 are provided so as to connect an atmospheric transport apparatus 20 and a vacuum transport apparatus 30, which will be described later.

The carrier station 10 includes the atmospheric transport apparatus 20 and a carrier stage 21. The carrier station 10 may be further provided with an aligner (not illustrated) configured to adjust an orientation of the wafer W.

The atmospheric transport apparatus 20 includes an atmospheric transport chamber 22 having the interior thereof under atmospheric pressure. The atmospheric transport chamber 22 is connected to the load-lock chambers 12a and 13a of the load-lock apparatuses 12 and 13 via gate valves G1 and G2, respectively. In the atmospheric transport chamber 22, a transport mechanism 23 is provided. The transport mechanism 23 transports the wafer W between the load-lock chambers 12a and 13a under atmospheric pressure.

The transport mechanism 23 includes a transport arm 23a. The transport arm 23a is configured as, for example, an articulated arm provided with a wafer holder configured to hold the wafer W at a tip end thereof. The transport mechanism 23 transports the wafer W while holding the wafer W by the transport arm 23a.

The carrier stage 21 is provided on a side surface of the atmospheric transport apparatus 20 opposite to the load-lock apparatuses 12 and 13. The wafers W in the carriers C placed on the carrier stage 21 are loaded into and unloaded from the atmospheric transport chamber 22 by the transport arm 23a of the transport mechanism 23 of the atmospheric transport apparatus 20.

The processing station 11 includes the vacuum transport apparatus 30 and processing apparatuses 40 to 43.

The vacuum transport apparatus 30 includes a vacuum transport chamber 31 having the interior thereof maintained in a reduced pressure state (a vacuum state). The vacuum transport chamber 31 is connected to the load-lock chambers 12a and 13a of the load-lock apparatuses 12 and 13 via gate valves G3 and G4, respectively. In addition, the vacuum transport chamber 31 is connected to each of vacuum processing chambers 44 to 47 to be described later via gate valves G5 to G8, respectively. In the vacuum transport chamber 31, a wafer transport mechanism 32 as a substrate transport for transporting the wafer W is provided. The wafer transport mechanism 32 loaded and unloaded the wafer W with respect to each of the processing apparatuses 40 to 43 via a loading and unloading port 100a which will be described later. The wafer transport mechanism 32 includes a transport arm 32a. Details of a configuration of the wafer transport mechanism 32 will be described later.

Each of the processing apparatuses 40 to 43 performs a predetermined process, such as a film forming process, a diffusion process, and an etching process on the wafer W under a reduced pressure. In the present embodiment, it is assumed that the processing apparatuses 40 to 43 perform an etching process by using plasma. The processing apparatuses 40 to 43 includes the vacuum processing chambers 44 to 47, respectively, in the interior of each of which an etching process is performed on the wafer W under a reduced pressure.

In addition, the wafer processing system 1 includes a control device 50. The control device 50 includes a controller 51 and a display 52 as a notification part.

The controller 51 includes, for example, a computer provided with a CPU, a memory, and the like, and has a storage (not illustrating) for storing various information. The storage stores a program for controlling a wafer processing in the wafer processing system 1 and a program for estimating a height of a focus ring, which will be described later, in each of the processing apparatuses 40 to 43. The programs may be recorded in a non-transitory computer-readable storage medium, and may be installed in the control device 50 from the storage medium. Some or all of the programs may be implemented by dedicated hardware (a circuit board).

The display 52 displays various information, and is configured with a display device such as a liquid crystal display or an organic display.

Processing Apparatus 40

Figure 2:
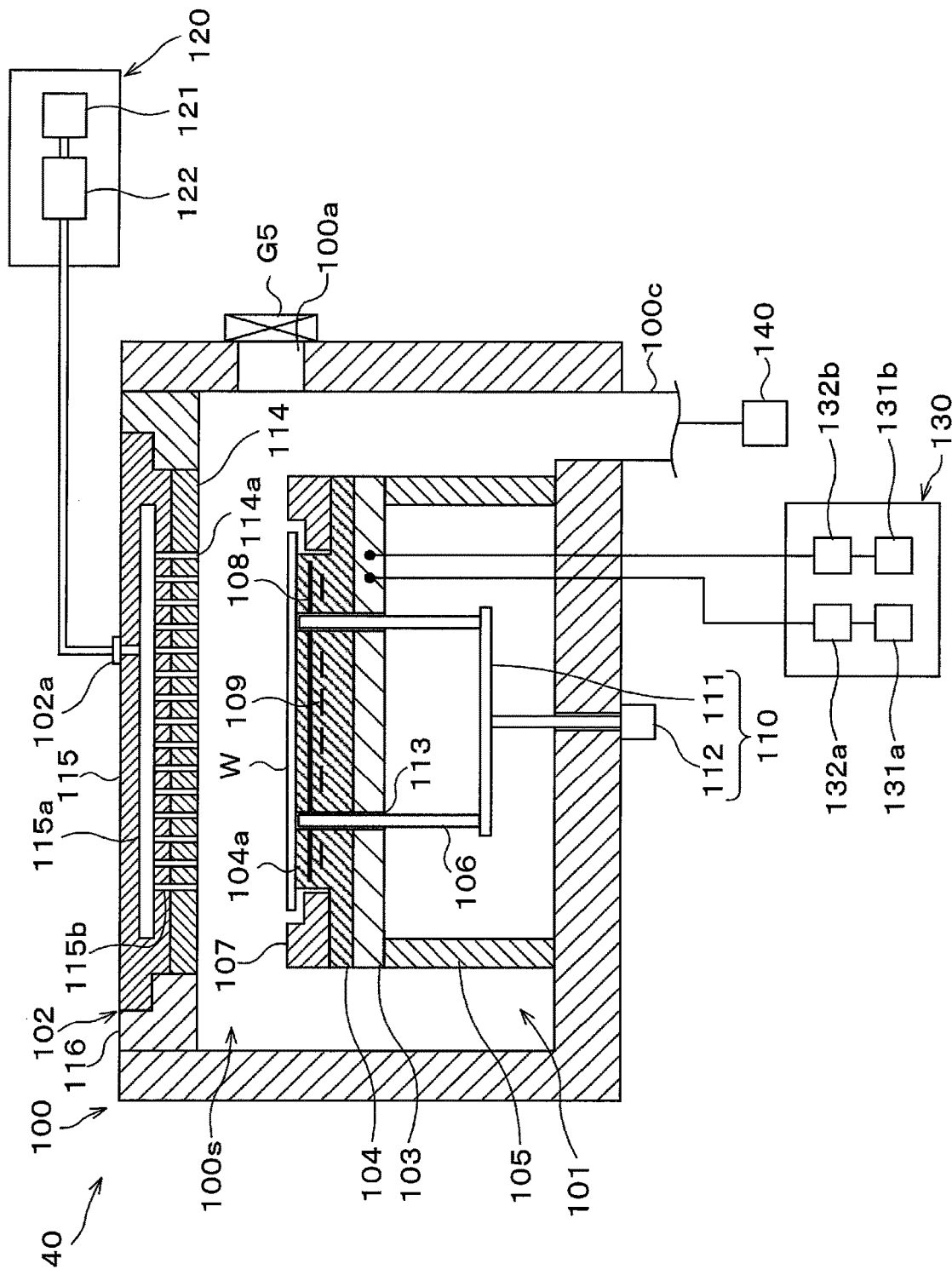
FIG. 2 is a vertical cross-sectional view illustrating an outline of the configuration of a processing apparatus.
Figure 3:
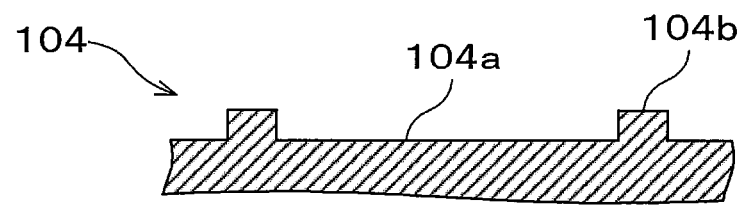
FIG. 3 is a partially enlarged cross-sectional view of an electrostatic chuck.

Next, the processing apparatus 40 will be described with reference to FIGS. 2 and 3. FIG. 2 is a vertical cross-sectional view illustrating an outline of a configuration of the processing apparatus 40. FIG. 3 is a partially enlarged cross-sectional view of an electrostatic chuck to be described later.

As illustrated in FIG. 2, the processing apparatus 40 includes a processing container 100, a gas supply 120, a radio frequency (RF) power supply 130, and an exhaust system 140. In addition, the processing apparatus 40 includes a stage 101 and a shower head 102.

The processing container 100 is a container, the interior of which is configured to be depressurized, and constitutes the vacuum processing chamber 44. A side wall of the processing container 100 is provided with a loading and unloading port 100a for the wafer W, and the loading and unloading port 100a is provided with the gate valve G5 configured to open and close the loading and unloading port 100a.

The stage 101 is disposed below a plasma processing space 100s in the processing container 100.

The stage 101 is configured to support the wafer W in the plasma processing space 100s. The stage 101 includes a lower electrode 103, an electrostatic chuck 104, an insulator 105, and lifting pins 106.

The lower electrode 103 is made of a conductive material such as aluminum.

The electrostatic chuck 104 is provided on the lower electrode 103 and attracts and holds the wafer W by an electrostatic force. The electrostatic chuck 104 includes, in a central portion thereof, a placement portion 104a having a top surface on which the wafer W is placed. In the electrostatic chuck 104, the top surface of the placement portion 104a is formed to be higher than a top surface of an outer peripheral portion of the electrostatic chuck 104. A focus ring 107 as an annular member is placed on the top surface of the outer peripheral portion surrounding the placement portion 104a of the electrostatic chuck 104.

The focus ring 107 is a member having an annular shape in a plan view (specifically, a circular annular shape in a plan view) and is disposed so as to surround the wafer W placed on the placement portion 104a of the electrostatic chuck 104. For example, the focus ring 107 is provided to improve uniformity of a plasma process (a plasma etching process in this example). The focus ring 107 is formed of a material appropriately selected according to the plasma process to be performed. The focus ring 107 is formed of, for example, silicon, silicon carbide, or quartz.

The placement portion 104a is provided with an electrode 108 configured to hold the wafer W through electrostatic attraction. The electrostatic chuck 104 has a configuration in which the electrode 108 is sandwiched between insulating materials.

A DC voltage from a DC power supply (not illustrated) is applied to the electrode 108. Due to an electrostatic force generated by the application of the DC voltage, the wafer W is attracted and held on the top surface of the placement portion 104a of the electrostatic chuck 104.

In addition, below the electrode 108 in the electrostatic chuck 104, a heater 109 as a temperature adjuster configured to adjust a temperature of the electrostatic chuck 104 is embedded. The heater 109 adjusts the temperature of the wafer W held by the electrostatic chuck 104 by adjusting a temperature of the electrostatic chuck 104.

As illustrated in FIG. 3, a plurality of convex portions 104b may be provided on the top surface of the placement portion 104a of the electrostatic chuck 104. This makes it possible to prevent the wafer W from being continuously attracted by the electrostatic chuck 104 due to a residual attractive force when the voltage application to the electrode 108 is stopped. The convex portions 104b are provided, for example, at equal intervals. The convex portions 104b are formed in a columnar shape having, for example, a diameter of 300 μm to 500 μm and a height of 5 μm to 30 μm.

As illustrated in FIG. 2, the insulator 105 supports the lower electrode 103. The insulator 105 is, for example, a cylindrical member having an outer diameter equivalent to an outer diameter of the lower electrode 103. The insulator 105 is made of ceramic or the like, and supports a peripheral edge portion of the lower electrode 103.

The lifting pins 106 are columnar members that are raised and lowered so as to protrude or sink from the top surface of the placement portion 104a of the electrostatic chuck 104, and is formed of, for example, ceramic. Three or more lifting pins 106 are provided at intervals from one another in a circumferential direction of the electrostatic chuck 104.

The lifting pins 106 are connected to a lifting mechanism 110 that raises and lowers the lifting pins 106. The lifting mechanism 110 includes, for example, a support 111 configured to support the lifting pins 106, and a drive 112 configured to generate a driving force for raising and lowering the support 111 so as to raise and lower the lifting pins 106. The drive 112 includes a driving source such as a motor that generates the driving force.

The lifting pins 106 are inserted into respective through holes 113 extending downward from the placement portion of the electrostatic chuck 104 to a bottom surface of the lower electrode 103.

The shower head 102 has a function as an upper electrode, and also functions as a shower head that supplies a processing gas from the gas supply 120 to the plasma processing space 100s. The shower head 102 is disposed above the stage 101 and constitutes a portion of a ceiling of the processing container 100. The shower head 102 includes an electrode plate 114 disposed to face the interior of the processing container 100 and a support 115 provided above the electrode plate 114. In addition, the shower head 102 is supported by an upper portion of the processing container 100 via an insulating shield 116.

A plurality of ejection holes 114a are formed in the electrode plate 114. The ejection holes 114a eject the processing gas or the like to the plasma processing space 100s.

The support 115 detachably supports the electrode plate 114. A gas diffusion chamber 115a is formed inside the support 115. A plurality of gas flow holes 115b in communication with the ejection holes 114a are formed from the gas diffusion chamber 115a.

The gas supply 120 includes one or more gas sources 121 and one or more flow rate controllers 122. The gas supply 120 supplies, for example, one or more processing gases or one or more cleaning gases from corresponding gas sources 121 to the gas diffusion chamber 115a via corresponding flow rate controllers 122, respectively.

In the processing apparatus 40, the processing gas from the gas source 121 selected from one or more gas sources 121 is supplied to the gas diffusion chamber 115a via the flow rate controller 122. Then, the processing gas supplied to the gas diffusion chamber 115a is dispersed and supplied in the form of a shower in the plasma processing space 100s through the gas flow holes 115b and the ejection holes 114a.

The RF power supply 130 includes, for example, two RF generators 131a and 131b and two matching circuits 132a and 132b. The RF generator 131a and the RF generator 131b are connected to the lower electrode 103 via the matching circuits 132a and 132b, respectively, and supply RF powers to the lower electrode.

The RF generator 131a generates and supplies RF power for plasma generation. The matching circuit 132a has a circuit for matching an output impedance of the RF generator 131a with an input impedance on a side of a load (the lower electrode 103).

The RF generator 131b generates and supplies RF power for drawing ions into the wafer W (radio-frequency bias power). The matching circuit 132b has a circuit for matching an output impedance of the RF generator 131b with an input impedance on the side of the load (the lower electrode 103).

The exhaust system 140 evacuates the interior of the plasma processing space 100s and includes a vacuum pump. The exhaust system 140 is connected to an exhaust port 100c provided in a bottom portion of the processing container 100.

Since the configurations of the processing apparatuses 41 to 43 are the same as the configuration of the processing apparatus 40, a description thereof will be omitted.

Wafer Processing

Next, wafer processing performed by using the wafer processing system 1 configured as described above will be described. The following processing is performed under a control of the controller 51.

First, the wafer W is taken out from the carrier C by the transport arm 23a of the transport mechanism 23, and the gate valve G1 is opened. Thereafter, the wafer W is loaded into the load-lock apparatus 12 by the transport arm 23a.

Subsequently, the gate valve G1 is closed, the interior of the load-lock apparatus 12 is sealed and depressurized.

When a pressure in the load-lock apparatus 12 becomes equal to or lower than a predetermined pressure, the gate valve G3 is opened, and the wafer W is received from a support (not illustrated) in the load-lock apparatus 12 by the transport arm 32a of the wafer transport mechanism 32 and taken out of the load-lock apparatus 12.

Next, after the gate valve G3 is closed, a gate valve for a processing apparatus that performs a target process (here, assumed as the gate valve G5 for the processing apparatus 40) is opened. Subsequently, the wafer W is loaded into the processing container 100 of the depressurized processing apparatus 40 by the transport arm 32a. Thereafter, lifting or the like of the lifting pins 106 is performed, and the wafer W is placed on the electrostatic chuck 104.

Subsequently, the gate valve G5 is closed, the processing container 100 of the processing apparatus 40 is sealed, and the interior of the processing container 100 is depressurized to a predetermined degree of vacuum by the exhaust system 140. In addition, a DC voltage is applied to the electrode 108 of the electrostatic chuck 104, whereby the wafer W is attracted to and held by the electrostatic chuck 104 by an electrostatic force.

Next, the processing gas is supplied from the gas supply 120 to the plasma processing space 100s via the shower head 102. In addition, radio frequency power for plasma generation is supplied from the RF power supply 130 to the lower electrode 103, whereby the processing gas is excited and plasma is generated. At this time, radio frequency power for ion drawing-in is also supplied from the RF power supply 130 to the lower electrode 103. Then, a plasma etching process is performed on the wafer W by the action of the generated plasma.

When the plasma etching process is completed, the supply of the radio frequency power from the RF power supply 130 and the supply of the processing gas from the gas supply 120 are stopped. Next, the application of the DC voltage to the electrode 108 is stopped, and the attraction and holding of the wafer W by the electrostatic chuck 104 is stopped.

Thereafter, the gate valve G5 of the processing container 100 is opened, the wafer W is unloaded from the processing container 100 of the processing apparatus 40 in the reverse procedure to that of loading the wafer W into the processing container 100 of the processing apparatus 40, and a series of wafer processes is completed.

In addition, before a wafer W to be processed next is loaded into the processing container 100 of the processing apparatus 40, a cleaning gas is supplied to the processing container 100 and cleaning is performed.

Wafer Transport Mechanism

Figure 4:
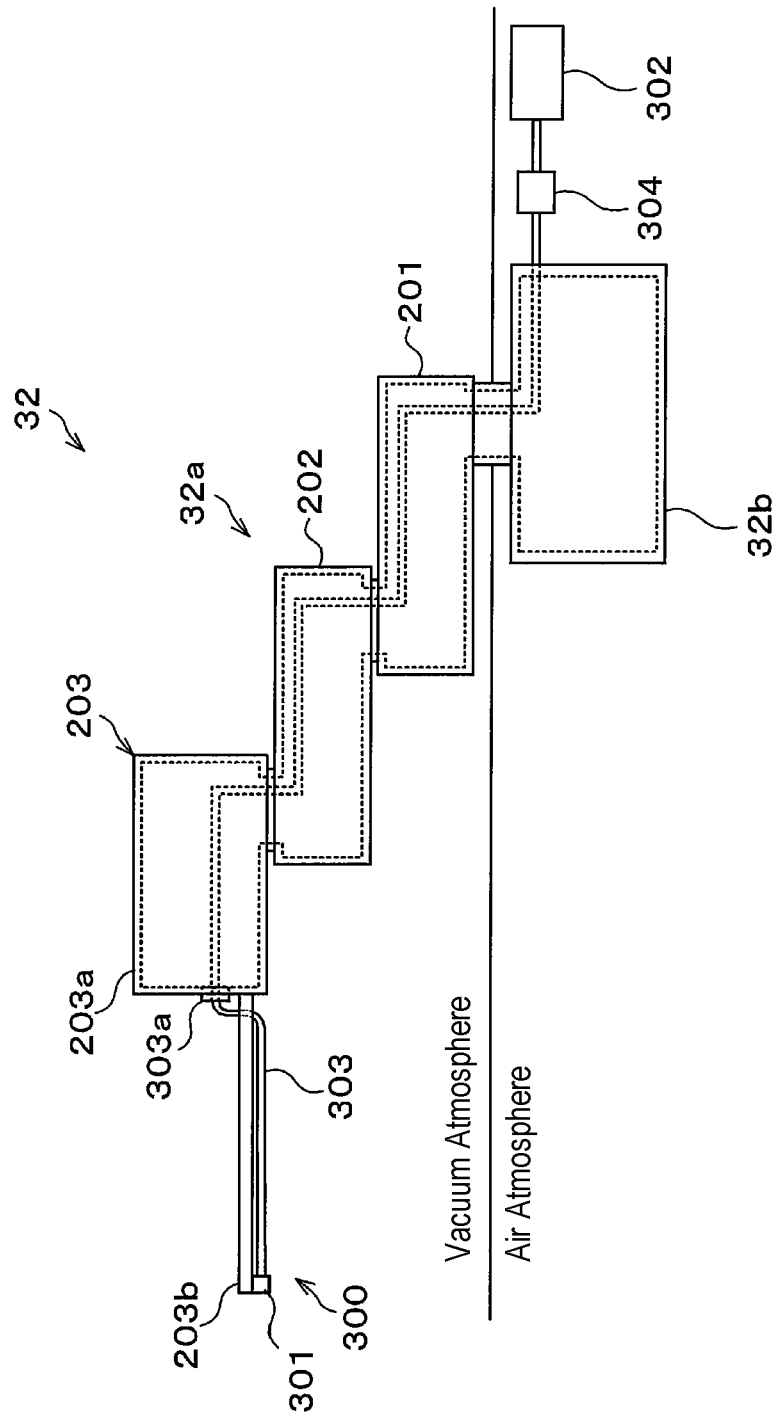
FIG. 4 is a side view schematically illustrating a configuration of a wafer transport mechanism.
Figure 5:
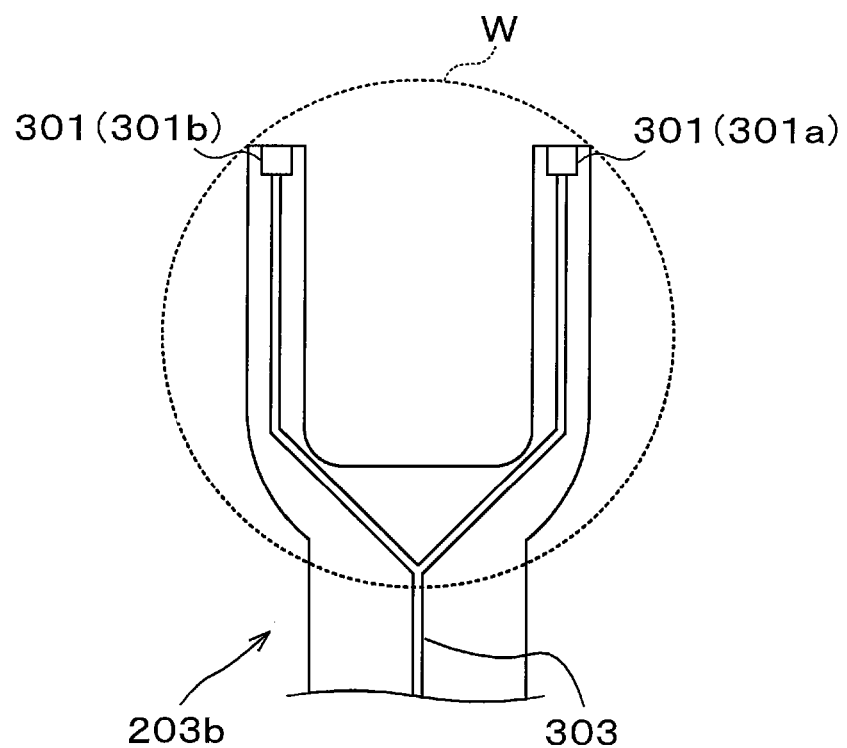
FIG. 5 is a bottom view illustrating an outline of a configuration of a fork.

Next, the wafer transport mechanism 32 will be described with reference to FIGS. 4 and 5. FIG. 4 is a side view schematically illustrating a configuration of the wafer transport mechanism 32. FIG. 5 is a bottom view illustrating an outline of a configuration of a fork to be described later.

As illustrated in FIG. 4, the wafer transport mechanism 32 includes the transport arm 32a and a base 32b, and is configured to transport the wafer W while holding the wafer W by the transport arm 32a. The wafer transport mechanism 32 may be provided with a plurality of transport arms.

The transport arm 32a is configured as, for example, an articulated arm. The base 32b pivotally supports a base end portion of the transport arm 32a.

The transport arm 32a has a first joint arm 201, a second joint arm 202, and a holding arm 203 as a substrate holder for holding the wafer W. A base end portion of the first joint arm 201 is connected to the base 32b to be rotatable around a vertical axis. The second joint arm 202 is connected to a tip end portion of the first joint arm 201 to be rotatable about the vertical axis. The holding arm 203 is connected to a tip end portion of the second joint arm 202 to be rotatable about the vertical axis.

The base 32b is provided with a drive (not illustrated) configured to drive the raising and lowering, rotating, and expanding and contracting of the transport arm 32a. The drive includes a driving source such as a motor that generates a driving force for raising and lowering the transport arm 32a, a driving force for rotating the transport arm 32a horizontally, and a driving force for expanding and contracting the transport arm 32a in a horizontal direction.

The holding arm 203 includes an accommodator 203a at a base end portion thereof and a fork 203b at a tip end portion thereof.

The interior of the accommodator 203a is formed as a hollow. For example, as illustrated in FIG. 5, the fork 203b has a bifurcated shape having a width smaller than a diameter of the wafer W. When the transport arm 32a is raised and lowered, the fork 203b is raised and lowered, and when the transport arm 32a rotates or expands and contracts, the fork 203b moves in the horizontal direction.

In the wafer transport mechanism 32, the transport arm 32a is located in the vacuum transport chamber 31 having a vacuum atmosphere, or the like, and the base 32b is provided in a space having an air atmosphere below the vacuum transport chamber 31.

In addition, the insides of the base 32b, the first joint arm 201, and the second joint arm 202 are all hollow like the accommodator 203a on a side of the base end of the holding arm 203. The space inside the accommodator 203a of the holding arm 203 is in communication with the space inside the base 32b, which has an air atmosphere, through the interiors of the first joint arm 201 and the second joint arm 202.

The wafer transport mechanism 32 configured as described above is controlled by the control device 50.

In addition, as illustrated in FIG. 4, the wafer transport mechanism 32 is provided with a distance measurement unit 300. The distance measurement unit 300 includes a distance sensor (also referred to as a "sensor head") 301 and a unit controller 302.

The distance sensor 301 measures a distance from the fork 203b (specifically, the distance sensor 301) to a target point. The distance sensor 301 is provided on the fork 203b. Specifically, for example, as illustrated in FIG. 5, one distance sensor 301a is provided at one tip end of the bifurcated portions of the fork 203b, and one distance sensor 301b is provided at the other tip end. The unit controller 302 controls measurement by the distance sensor 301 under a control of the controller 51.

As a distance measurement method using the distance sensor 301, a method capable of measuring a distance in a non-contact manner in a vacuum atmosphere, for example, a method based on light, is adopted. In this case, for example, the distance sensor 301 emits light for distance measurement to an object and receives reflected light, and based on the light reception result by the distance sensor 301, the unit controller 302 measures the distance from the fork 203b (specifically, the distance sensor 301) to the target point.

A more specific example of the distance measurement method using the distance sensor 301 is a white confocal method. When the white confocal method is adopted, for example, white light supplied from a light source (not illustrated) such as an LED included in the unit controller 302 is emitted from the distance sensor 301 to an object such that the white light is focused at different heights for respective wavelengths contained in the white light. Then, only light having a wavelength focused on the object is input to the unit controller 302 via the distance sensor 301 as reflected light. The unit controller 302 calculates the distance from the fork 203b (specifically, the distance sensor 301) to the target point based on the wavelength of the input light. The distance sensor 301 is disposed such that an optical axis of the white light is substantially parallel to a vertical direction. The white confocal method is just an example, and any method may be used as long as it can measure a distance with desired accuracy (for example, with a resolution of 15 µm or less in a height direction and a resolution of about 0.1 mm in the horizontal direction).

The distance sensor 301 and the unit controller 302 are connected via an optical fiber 303, and the above-described distant measuring light (white light) and reflected light are transmitted via the optical fiber 303. An optical switch 304 is interposed in the optical fiber 303.

The unit controller 302 and the optical switch 304 are provided in a space having an air atmosphere outside the vacuum transport chamber 31.

The optical fiber 303 is disposed to penetrate side walls of the accommodator 203a of the holding arm 203 and the base 32b. A feedthrough 303d is formed in a portion of the optical fiber 303 that penetrates the side wall of the accommodator 203a such that the vacuum atmosphere in the vacuum transport chamber 31 or the processing container 100 of each of the processing apparatuses 40 to 43 is not impaired.

In addition, the optical fiber 303 and the distance sensor 301 are disposed such that holding the wafer W by the holding arm 203 is not hindered. Specifically, the optical fiber 303 is arranged along a bottom surface of the holding arm 203, and the distance sensor 301 is arranged on a bottom surface of the fork 203b such that, when the wafer W is delivered to the fork 203b of the holding arm 203, an upper portion of the distance sensor 301 does not come into contact with the wafer W.

Controller 51

Height Estimation Example 1

Figure 6:
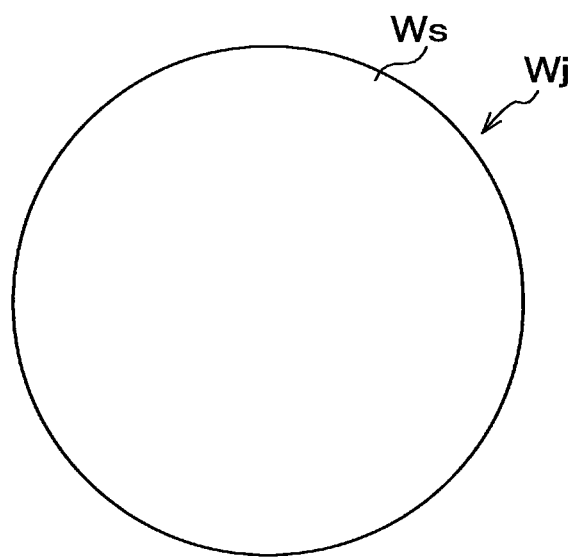
FIG. 6 is a plan view illustrating an example of a jig wafer as a jig substrate used for estimating a height of a focus ring.
Figure 7:
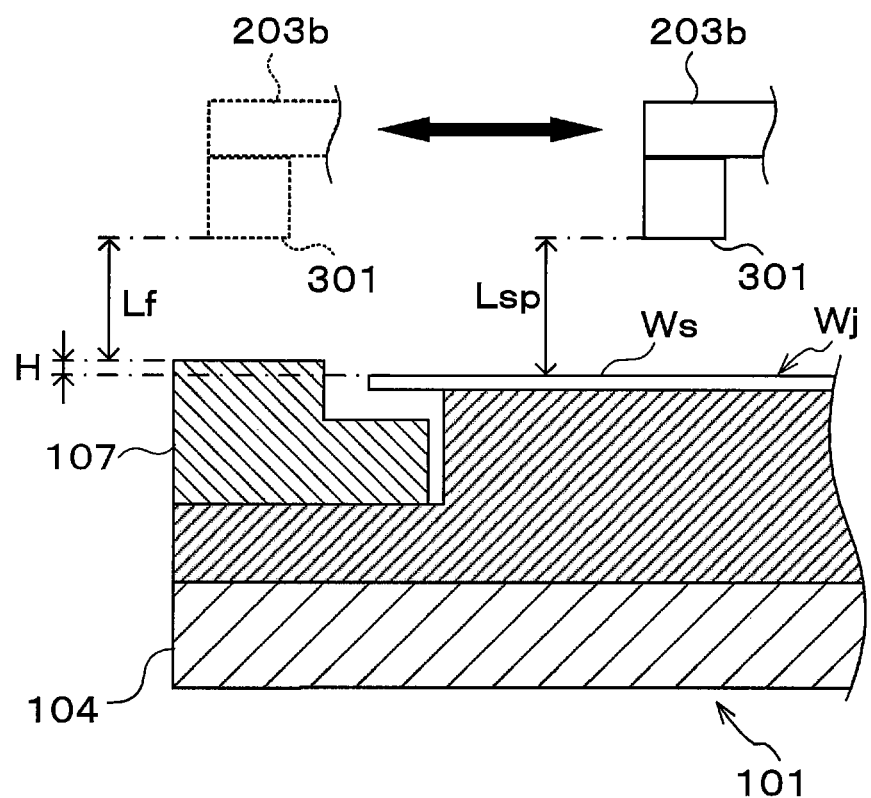
FIG. 7 is a view illustrating positions of a fork and a distance sensor with respect to a stage when estimating the height of the focus ring.

Subsequently, processes performed by the controller 51 when estimating the height of the focus ring 107 placed on the electrostatic chuck 104 will be described. FIG. 6 is a plan view illustrating an example of a jig wafer as a jig substrate used for estimating the height of the focus ring 107. FIG. 7 is a view illustrating positions of the fork 203b and the distance sensor 301 with respect to the stage 101 when estimating the height of the focus ring 107.

In the wafer processing system 1, the focus ring 107 placed on the electrostatic chuck 104 is consumed by the above-described wafer processing using plasma. In order to determine a degree of wear of the focus ring 107, in the wafer processing system 1, the controller 51 estimates the height of the focus ring 107 placed on the electrostatic chuck 104 based on the measurement results by the distance sensor 301.

In the wafer processing system 1, when estimating the height of the focus ring 107, a jig wafer Wj illustrated in FIG. 6 is used. The jig wafer Wj has the same shape in a plan view and material as the wafer W actually processed with plasma. The jig wafer Wj has a reference surface Ws that serves as a reference for the height of the focus ring 107, and is placed on the electrostatic chuck 104 such that the reference surface Ws faces upward. Hereinafter, a surface of the jig wafer Wj that faces upward when the jig wafer Wj is placed on the electrostatic chuck 104 will be referred to as a top surface. In one example, the entire top surface of the jig wafer Wj is formed flat, and the entire surface serves as the reference surface Ws. In addition, a thickness of the jig wafer Wj may be the same as or different from the actual wafer W. The jig wafer Wj is received in, for example, the carrier C when not in use.

When estimating the height of the focus ring 107, the controller 51 controls respective components of the wafer processing system 1 (i.e., outputs control signals) such that the jig wafer Wj is placed on the electrostatic chuck 104 of the stage 101 on which the focus ring 107 is placed, by the wafer transport mechanism 32.

In addition, the controller 51 controls respective components of the wafer processing system 1 to position the fork 203b above the stage 101 on which the jig wafer Wj and the focus ring 107 are placed, as illustrated in FIG. 7. In addition, the controller 51 controls the wafer transport mechanism 32 and the unit controller 302 (that is, outputs control signals) to cause the distance sensor 301 to measure the distance from the fork 203b located above the stage 101 to the reference surface Ws of the jig wafer Wj and the distance from the fork 203b (specifically, the distance sensor 301) to the focus ring 107. Specifically, for example, the controller 51 controls the wafer transport mechanism 32 and the unit controller 302 to cause light for distance measurement to be emitted from the distance sensor 301 to a predetermined reference position on the reference surface Ws of the jig wafer Wj and to cause reflected light to be received by the distance sensor 301. Next, the controller 51 controls the unit controller 302 to calculate a distance Lsp from the fork 203b to the predetermined reference position on the reference surface Ws of the jig wafer Wj based on the result of receiving the light. Similarly, the controller 51 controls the wafer transport mechanism 32 and the unit controller 302 to cause the light for distance measurement to be emitted to the focus ring 107 from the distance sensor 301, and causes the distance sensor 301 to receive reflected light. Next, the controller 51 controls the unit controller 302 to calculate a distance Lf from the fork 203b to the focus ring 107 based on the result of receiving the light. Hereinafter, "distance from fork 203b to XX" may be abbreviated as "distance to XX".

Then, the controller 51 calculates or estimates the height of the focus ring 107 based on the distance to the reference surface Ws and the distance to the focus ring 107. For example, the controller 51 calculates a height H of the focus ring 107 (specifically, a height from the reference surface Ws) based on Equation (1) below using the distance Lsp and the distance Lf.

$$H = Lsp - Lf \quad \text{Equation (1)}$$

Height Estimation Example 2

Figure 8:
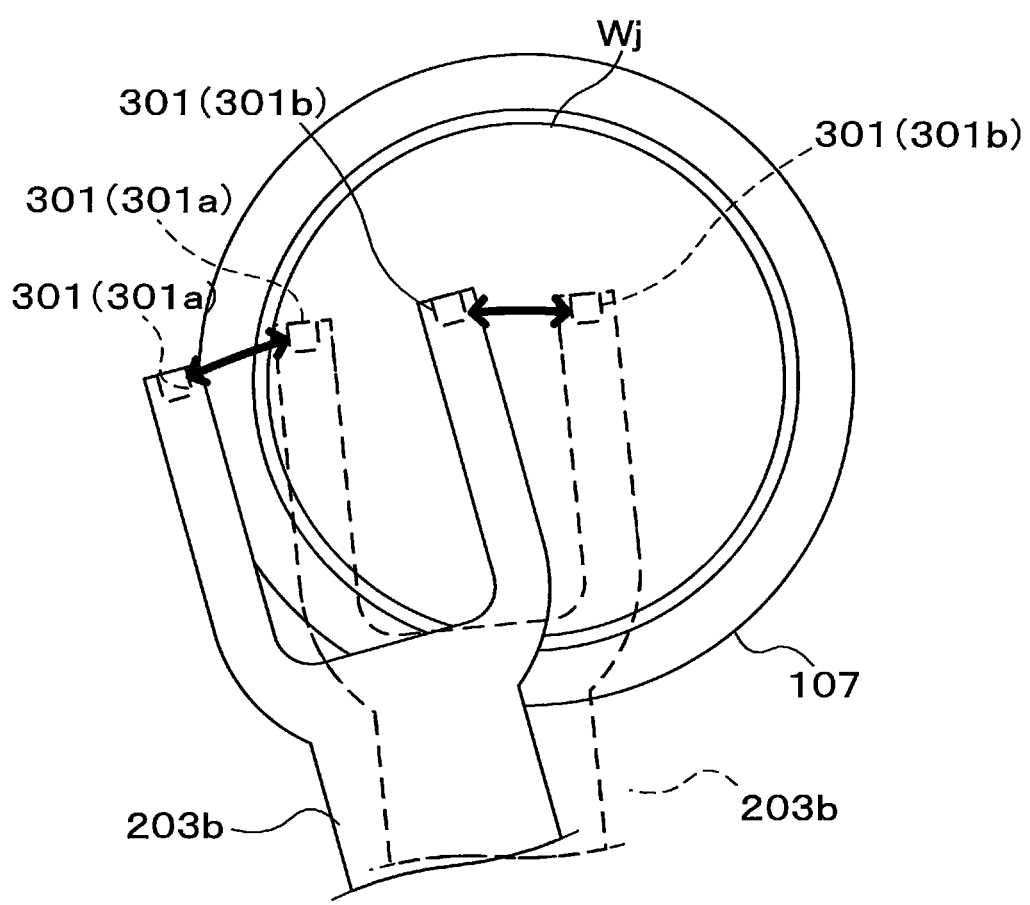
FIG. 8 is a view for describing another mode of estimating the height of the focus ring.

FIG. 8 is a view for describing another mode of estimating the height of the focus ring 107. When the distance sensor 301 measures the distance to the focus ring 107, the controller 51 may control the wafer transport mechanism 32 such that the fork 203b moves so that the distance sensor 301a moves in a predetermined direction, as illustrated in FIG. 8. The predetermined direction is a direction that crosses the focus ring 107 in a plan view and is a direction that intersects with an insertion and removal direction (the vertical direction in FIG. 8) of the fork 203b with respect to the processing container 100.

Specifically, when the distance sensor 301a measures the distance to the focus ring 107, the controller 51 may control the wafer transport mechanism 32 such that the fork 203b rotates around the base end of the fork 203b, whereby the distance sensor 301a moves in a direction crossing the focus ring 107 in a plan view. In addition, the controller 51 may perform a control such that the transport arm 32a rotates around the base end of the transport arm 32a whereby the distance sensor 301a moves in a direction crossing the focus ring 107 in a plan view.

As described above, while the distance sensor 301a moves in the direction crossing the focus ring 107 in a plan view, the controller 51 controls the unit controller 302 such that the distance sensor 301a continuously measures the distance Lf to the focus ring 107. Then, the controller 51 estimates a height distribution or profile of the focus ring 107 in the crossing direction based on, for example, the results of continuously measuring the distance Lsp to the reference point of the reference surface Ws of the jig wafer Wj and the distance Lf to the focus ring 107. Specifically, the controller 51 calculates the height H of the focus ring 107 for each measurement point of the distance Lf to the focus ring 107 based on the Equation (1), and creates a height distribution of the focus ring 107 in the crossing direction from each calculation result and position information of each measurement point. The position information of each measurement point may be calculated from an angle and dimension of each constituent member of the transport arm 32a at the time of measuring the distance Lf.

Height Estimation Example 3

Figure 9:
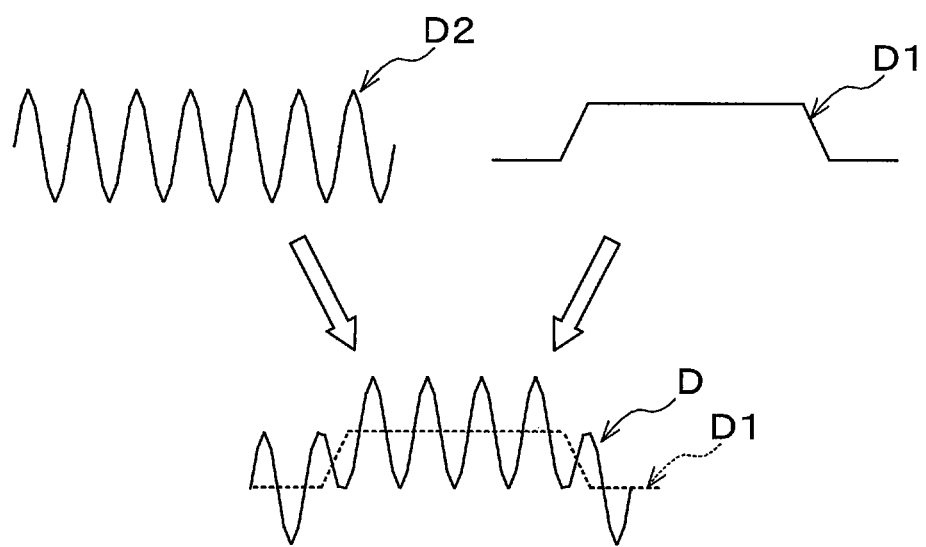
FIG. 9 is a view illustrating an example of a result of estimating the height of the focus ring when the fork vibrates while moving.

When the fork 203b is moved in the crossing direction as in Example 2 above, the fork 203b may vibrate during the movement. FIG. 9 is a view illustrating an example of an estimation result of the height of the focus ring 107 when the fork 203b vibrates while moving. When the fork 203b vibrates, if a profile D of the height of the focus ring is estimated as in Example 2 described above, as illustrated in FIG. 9, the profile D may have a vibration component D2 of the fork 203b superimposed on an actual profile D1 at the height of the focus ring 107.

In order to remove the influence of the vibration component D2 of the fork 203b, the following may be performed. That is, as illustrated in FIG. 8, while the fork 203b is moving such that one distance sensor 301a moves in a direction crossing the focus ring 107 in a plan view, the one distance sensor 301a continuously measures the distance to the focus ring 107. In parallel with this, the other distance sensor 301b continuously measures the distance to the reference surface Ws of the jig wafer Wj. Then, the controller 51 estimates the profile D of the height of the focus ring in the crossing direction based on the measurement results of a distance Lft to the focus ring 107 and the measurement results of a distance Lst to the reference surface Ws at each time point during the measurement by the distance sensor 301a and the distance sensor 301b. Specifically, the controller 51 calculates a height Ht of the focus ring 107 based on the difference between the distance Lft and the distance Lst at each time point during the measurement by the distance sensor 301a and the distance sensor 301b, that is, based on Equation (2) below.

$$Lst - Lft = Ht \quad \text{Equation (2)}$$

The controller 51 creates the profile of the height of the focus ring 107 in the crossing direction from the calculation result of the height Ht at each time point during measurement by the distance sensor 301a and the distance sensor 301b and position information of measurement points by the distance sensor 301a in the crossing direction of the focus ring 107. The profile obtained as described above is a profile from which the influence of the vibration component D2 of the fork 203b is removed.

Other Effect of Height Estimation Example 3

Figure 10:
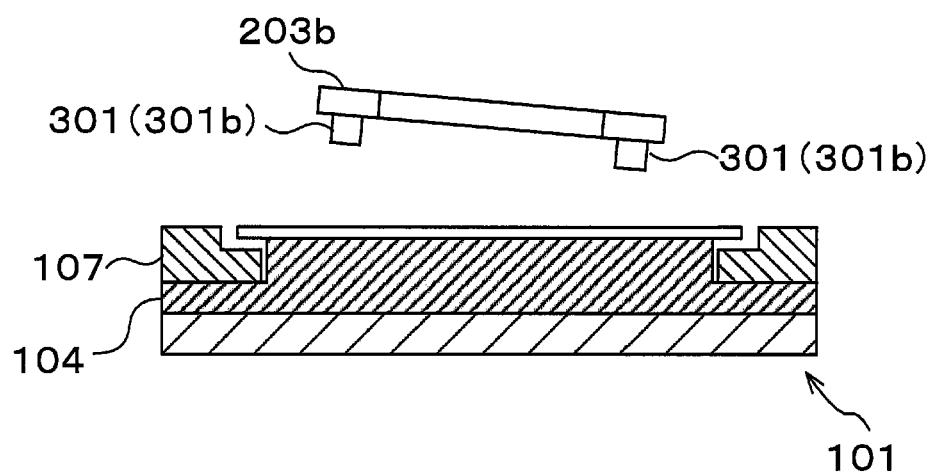
FIG. 10 is a diagram for describing other effect by creating a profile of the height of the focus ring as in Example 3.
Figure 11:
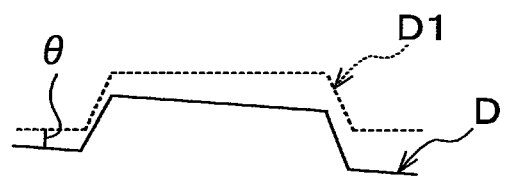
FIG. 11 is a view for describing other effect by creating the profile of the height of the focus ring as in Example 3.

In addition, FIGS. 10 and 11 are views for describing other effects by creating the profile of the height of the focus ring 107 as in Example 3 described above. As illustrated in FIG. 10, the fork 203b may be tilted, rather than being parallel to the stage 101. In this case, when the profile D of the height of the focus ring 107 in the crossing direction from the reference surface Ws is estimated by using Equation (1) described above, the profile D differs from the actual profile D1 of the height of the focus ring 107 by an amount of the inclination θ of the fork 203b with respect to the stage 101, as illustrated in FIG. 11. In contrast, by creating a profile of the height of the focus ring 107 in the crossing direction from the reference surface Ws as in Example 3 described above, the influence of the inclination θ of the fork 203b on the stage 101 can be removed.

Estimation Method

Subsequently, an example of a method of estimating the height of the focus ring 107 by using the wafer processing system 1 will be described. The height of the focus ring 107 is estimated, for example, every time a predetermined period elapses or every time a predetermined number of wafers are processed.

Step S1: Loading Jig Wafer Wj

First, under the control of the controller 51, the jig wafer Wj is placed on the stage 101, on which the focus ring 107 is placed, by the wafer transport mechanism 32.

Specifically, the jig wafer Wj is taken out from the carrier C by the transport arm 23a of the transport mechanism 23, and the gate valve G1 is opened. Thereafter, the jig wafer Wj is loaded into the load-lock apparatus 12 by the transport arm 23a and delivered to the support (not illustrated) in the load-lock apparatus 12.

Subsequently, the transport arm 23a is extracted from the load-lock apparatus 12, the gate valve G1 is closed, and the interior of the load-lock apparatus 12 is sealed and depressurized.

When the pressure in the load-lock apparatus 12 becomes equal to or lower than a predetermined pressure, the gate valve G3 is opened, and the jig wafer Wj is received from the support (not illustrated) in the load-lock apparatus 12 by the transport arm 32a of the wafer transport mechanism 32 and taken out of the load-lock apparatus 12.

Next, after the gate valve G3 is closed, the gate valve for the processing apparatus in which the height of the focus ring 107 is to be measured (here, assumed as the gate valve G5 for the processing apparatus 40) is opened. Subsequently, the fork 203b of the transport arm 32a holding the jig wafer Wj is inserted into the processing container 100 of the depressurized processing apparatus 40. Thereafter, raising and lowering of the lifting pins 106 and extraction of the fork 203b from the processing container 100 are performed, and the jig wafer Wj is placed on the electrostatic chuck 104 of the stage 101 within the processing container 100 via the lifting pins 106.

Step S2: Measuring Reference Point

Next, under the control of the controller 51, the distance Lsp from the fork 203b located above the stage 101 to the reference point on the reference surface Ws of the jig wafer Wj is measured by the distance sensor 301.

Specifically, the fork 203b is re-inserted into the processing container 100 of the processing apparatus 40 and moved above the stage 101. Then, the distance Lsp to the reference point on the reference surface Ws of the jig wafer Wj is measured by each of the distance sensor 301a and the distance sensor 301b. The distance Lsp to the reference point on the reference surface Ws when the fork 203b is in an ideal state (a state in which tilting of the fork 203b with respect to the stage 101, sagging of the fork 203b, or the like is not present), that is, a design value of the distance Lsp, is stored in advance in the storage (not illustrated).

Step S3: Measuring Distance to Reference Surface Ws and Distance to Focus Ring 107

Subsequently, under the control of the controller 51, the distance from the fork 203b located above the stage 101 to the focus ring 107 and the distance from the fork 203b to the reference surface Ws are measured by the distance sensor 301.

Specifically, for example, the fork 203b is moved such that one distance sensor 301a moves in a direction crossing a portion of the focus ring 107 facing the one distance sensor 301a in a plan view. During this movement, the one distance sensor 301a continuously measures the distance to the focus ring 107, and the other distance sensor 301b continuously measures the distance to the reference surface Ws of the jig wafer Wj.

In addition, for example, the fork 203b is moved such that the other distance sensor 301b moves in a direction crossing a portion of the focus ring 107 facing the other distance sensor 301b in a plan view. During this movement, the other distance sensor 301b continuously measures the distance to the focus ring 107, and the distance sensor 301a continuously measures the distance to the reference surface Ws of the jig wafer Wj.

Step S4: Estimating Height of Focus Ring 107

Then, the controller 51 estimates the height of the focus ring 107 based on the measurement results in step S3.

Specifically, for example, with respect to the portion of the focus ring 107 facing the distance sensor 301a, the controller 51 calculates the height Ht of the focus ring 107 based on the difference between the distance Lft and the distance Lst at each time point during the measurement in step S3, that is, based on Equation (2) described above. The controller 51 creates a height profile of the focus ring 107 in the crossing direction of the distance sensor 301a, from the calculation result of the height Ht at each time point during the measurement in step S3 and the position information of the measurement points by the distance sensor 301a.

In addition, the controller 51 also creates, with respect to the portion of the focus ring 107 facing the distance sensor 301b, a height profile of the focus ring 107 in the crossing direction of the distance sensor 301b, in the same manner as the portion facing the distance sensor 301a.

Furthermore, the height profile of the focus ring 107 created in step S4 may be corrected based on the distance Lsp to the reference point on the reference surface Ws of the jig wafer Wj measured by each of the distance sensor 301a and the distance sensor 301b in step S2, and the design value of the distance Lsp. As a result, when the fork 203b sags by its own weight due to a temporal change or the like, the influence of the sagging can be removed from the estimation result of the height profile of the focus ring 107.

Step S5

The jig wafer Wj is unloaded in parallel with step S4 or after step S4 under the control of the controller 51. Specifically, extraction and re-insertion of the fork 203*b* from and into the processing container 100 of the processing apparatus 40, and raising and lowering of the lifting pins 106 are performed so that the jig wafer Wj is received by the fork 203*b*. Then, the jig wafer Wj is unloaded from the processing container 100 of the processing apparatus 40 in the reverse procedure to that of loading the wafer W into the processing container 100 of the processing apparatus 40.

Effects of the Embodiment

As described above, in the present embodiment, when the height of the focus ring 107 is estimated, the jig wafer Wj having the reference surface Ws of the height of the focus ring 107 is placed on the stage 101. Specifically, the jig wafer Wj is placed on the top surface of the placement portion 104*a* of the electrostatic chuck 104 of the stage 101. Then, the height of the focus ring 107 is estimated based on the measurement results of the distance to the reference surface Ws and the distance to the focus ring 107 by the distance sensor 301 provided on the fork 203*b* of the wafer transport mechanism 32. Therefore, the height of the focus ring 107 can be accurately estimated even when the convex portions 104*b* are provided on the top surface of the placement portion 104*a* of the electrostatic chuck 104 of the stage 101, as illustrated in FIG. 3.

In addition, as for the height of the focus ring 107, a height with respect to a top surface of the wafer W, which is placed on the top surface of the placement portion 104*a* of the electrostatic chuck 104, as a reference is important. The reason is because this height affects a shape of a plasma sheath and affects the result of a plasma process. However, since the top surface of the placement portion 104*a* of the electrostatic chuck 104 may be consumed as the plasma process is repeated, the height of the focus ring 107 estimated with respect to the top surface of the placement portion 104*a* of the electrostatic chuck 104 as a reference may not correspond to the height with respect to the top surface of the wafer W, which is placed on the top surface of the placement portion 104*a* of the electrostatic chuck 104, as a reference. In contrast, in the present embodiment, the top surface of the jig wafer Wj placed on the top surface of the placement portion 104*a* of the electrostatic chuck 104 is set as the reference surface Ws of the height of the focus ring 107. In addition, since the jig wafer Wj is located outside the processing container 100 during the plasma process, the jig wafer Wj is not consumed. Therefore, the height of the focus ring 107 estimated as in the present embodiment corresponds to the height with respect to the top surface of the wafer W, which is placed on the top surface of the placement portion 104*a* of the electrostatic chuck 104, as a reference even when the top surface of the placement portion 104*a* have been worn out. Therefore, according to the present embodiment, it is possible to accurately determine whether or not the degree of wear of the focus ring 107 is within a range that does not affect the shape of the plasma sheath.

In addition, according to the present embodiment, the height of the focus ring 107 can be estimated without opening the interior of the processing container 100 to the air.

In the present embodiment, the profile of the height of the focus ring 107 in the crossing direction is estimated by moving the fork 203*b* such that the distance sensor 301*a* moves in the direction crossing the focus ring 107 in a plan view. When a lifespan of the focus ring 107 is determined based on the estimation result of the height profile of the focus ring 107 in the crossing direction, the following effect is obtained compared to the case in which the lifespan of the focus ring 107 is determined based on the estimation result of the height of one point of the focus ring 107. That is, when there is a difference in the amount of wear of the focus ring 107 in a radial direction of the focus ring 107, the lifespan of the focus ring 107 can be determined more accurately.

In the present embodiment, the height profiles of the two portions of the focus ring 107, i.e., the portion facing one distance sensor 301*a* and the portion of facing the other distance sensor 301*b*, in the crossing direction are acquired. When the lifespan of the focus ring 107 is determined based on the height profiles of these two portions, the following effect is obtained. That is, when there is a difference in the amount of wear of the focus ring 107 in the circumferential direction of the focus ring 107, the lifespan of the focus ring 107 can be determined more accurately.

Another Example of Jig Wafer

Figure 12:
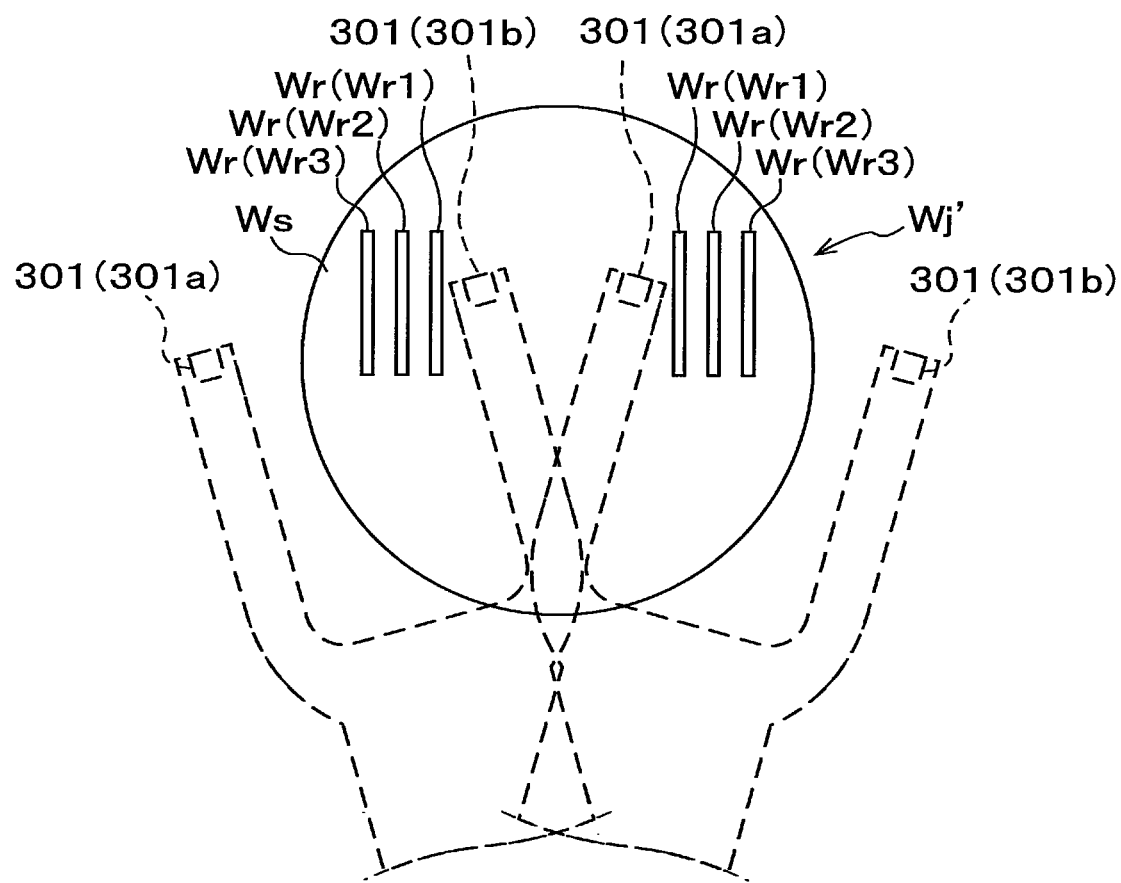
FIG. 12 is a plan view schematically illustrating another example of the jig wafer.
Figure 13:
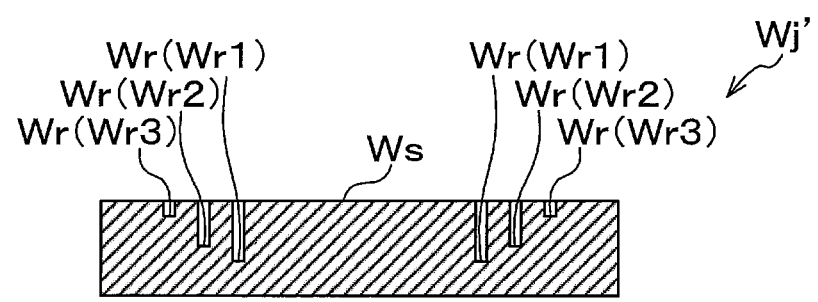
FIG. 13 is a cross-sectional view schematically illustrating another example of the jig wafer.

FIGS. 12 and 13 are a plan view and a cross-sectional view, respectively, which schematically illustrate another example of the jig wafer. As illustrated in FIGS. 12 and 13, a jig wafer Wj' has a plurality of correction surfaces Wr, each of which is separated by a predetermined distance in the height direction from the reference surface Ws, and the distances of the correction surfaces Wr from the reference surface Ws in the height direction are different from one another. In the example of the drawings, correction surfaces Wr1 to Wr3 are provided as the correction surfaces Wr for each of the distance sensor 301*a* and the distance sensor 301*b*. For the correction surfaces Wr1 to Wr3, the distances from the reference surface Ws are determined in advance with high accuracy. In the example of the drawings, the jig wafer Wj' has grooves recessed from the reference surface Ws, and bottom surfaces of the grooves constitute the correction surfaces Wr1 to Wr3, respectively. However, unlike this example, convex portions protruding from the reference surface Ws may be formed on the jig wafer Wj', and the correction surfaces Wr1 to Wr3 may be constituted with top surfaces of the convex portions. The distances of the correction surfaces Wr1, Wr2, and Wr3 from the reference surfaces Ws are, for example, 100 µm, 50 µm, and 25 µm, respectively.

In the case of placing and using the jig wafer Wj', when the distance sensor 301 measures the distance to the reference surface Ws and the distance to the focus ring 107, distances to the correction surfaces Wr are also measured. For example, the distance sensor 301 measures the distance to the correction surface Wr1 and the distance to the correction surface Wr2. Then, the controller 51 corrects the measurement results by the distance sensor 301 based on the measurement results of the distances to the correction surfaces Wr. Specifically, the controller 51 takes, for example, a difference between the distance to the correction surface Wr1 and the distance to the correction surface Wr2 measured by the distance sensor 301. Then, the controller 51 corrects the measurement results by the distance sensor 301 such that the difference approaches a design value of the difference. Thus, it is possible for the distance sensor 301 to measure the distance to the reference surface Ws and the distance to the focus ring 107 more accurately so that the height of the focus ring 107 can be estimated more accurately. The design value of the difference is stored in advance in the storage (not illustrated).

When the height of the focus ring 107 is estimated by using the jig wafer Wj' as in Example 3 described above, the correction surfaces Wr are provided in the following region of the jig wafer Wj'. That is, the correction surfaces Wr are provided in a region on the jig wafer Wj' in which the continuous measurement of the distance to the reference surface Ws by the distance sensors 301a and 301b is not hindered when the fork 203b is moved.

Another Example of Wafer Transport Mechanism 32

Figure 14:
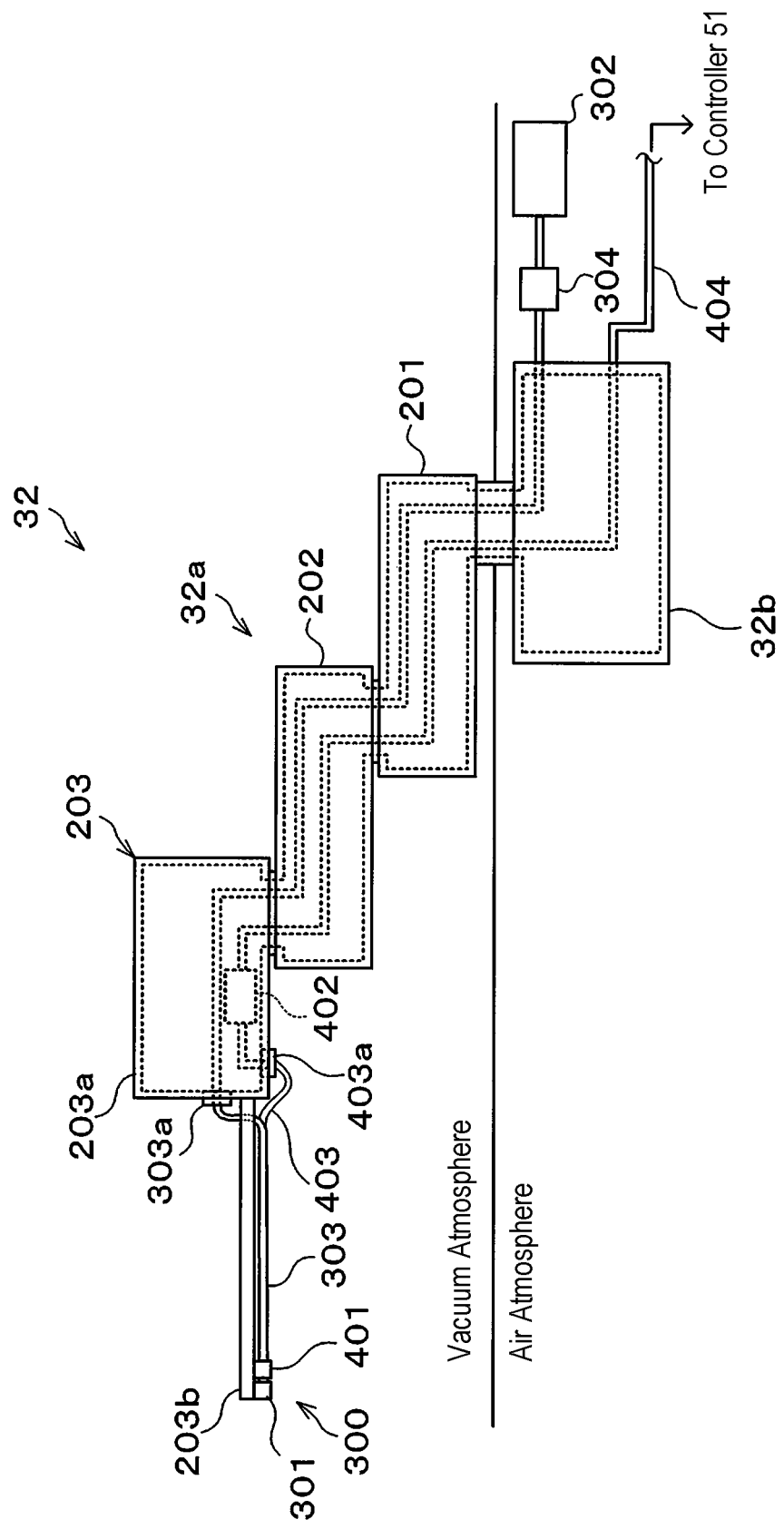
FIG. 14 is a view illustrating another example of the wafer transport mechanism.

FIG. 14 is a view illustrating another example of the wafer transport mechanism 32. The stage 101 is provided with the heater 109 as described above. When it is necessary to heat the electrostatic chuck 104 by the heater 109 during the plasma process, it is desirable to continue heating by the heater 109 even during the process of estimating the height of the focus ring 107 in order to suppress a decrease in throughput. However, when the heating by the heater 109 continues, a temperature of the distance sensor 301 may rise when the fork 203b is located above the stage 101. The measurement results of the distance sensor 301 may depend on the temperature, and in this case, the height of the focus ring 107 estimated based on the measurement results by the distance sensor 301 are affected by the temperature.

In order to avoid the aforementioned problem, as illustrated in FIG. 14, a temperature sensor 401 configured to measure the temperature of the distance sensor 301 may be provided, and the temperature of the distance sensor 301 at the time of the measurement by the distance sensor 301 may be measured by the temperature sensor 401. Then, the controller 51 may correct the measurement results by the distance sensor 301 based on the measurement result of the temperature of the distance sensor 301 at the time of the measurement by the distance sensor 301.

The temperature sensor 401 is provided in a vicinity of the distance sensor 301, for example, as illustrated in FIG. 14. For example, the temperature sensor 401 is provided at a position adjacent to the distance sensor 301 on the bottom surface of the fork 203b. When two distance sensors 301a and 301b are provided as the distance sensor 301, for example, the temperature sensor 401 is provided for each of the distance sensor 301a and the distance sensor 301b.

The temperature measurement result by the temperature sensor 401 is sent to the controller 51 via a gateway board 402. The gateway board 402 is accommodated in the accommodator 203a of the holding arm 203. The gateway board 402 and the temperature sensor 401 are connected to each other via a wire 403, and the gateway board 402 and the controller 51 are connected via a communication cable 404.

The wire 403 is arranged to penetrate a bottom wall of the accommodator 203a of the holding arm 203. A feedthrough 403a is formed in a portion of the wire 403 that penetrates the bottom wall of the accommodator 203a so that the vacuum atmospheres in the vacuum transport chamber 31 and the processing containers 100 of the processing apparatuses 40 to 43 are not impaired.

In the case of using the temperature sensor 401, when the distance sensor 301 measures the distance to the focus ring 107 or the reference surface Ws, for example, the temperature of the distance sensor 301 at each measurement time point is also measured by the temperature sensor 401. Specifically, for example, as in Examples 2 and 3 described above, when continuously measuring the distance by the distance sensor 301a while moving the fork 203b, the temperature of the distance sensor 301 at each distance measurement time point is also measured by the temperature sensor 401. Hereinafter, "continuously measuring the distance by the distance sensor 301a while moving the fork 203b" will be referred to as "scan distance measurement by the distance sensor 301a."

In addition, when the temperature sensor 401 is used, a distance to a predetermined portion of the jig wafer Wj or the jig wafer Wj' is measured at least twice by the distance sensor 301 with a time interval, and the temperature of the distance sensor 301 at each measurement time point is also measured by the temperature sensor 401. Specifically, for example, before and after the scan distance measurement by the distance sensor 301a, the distance to the correction surface Wr1 on the jig wafer Wj' is measured by the distance sensor 301a, and the temperature of the distance sensor 301a at the time of each measurement is also acquired by the temperature sensor 401.

Figure 15:
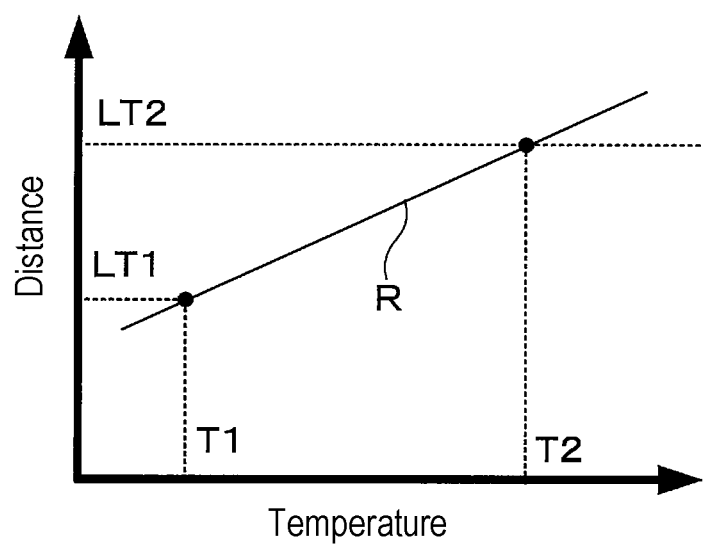
FIG. 15 is a view illustrating an example of a correlation between a measurement result by the distance sensor and a temperature of the distance sensor.

Based on the measurement results obtained by measuring the distance to the predetermined portion of the jig wafer Wj or the jig wafer Wj' by the distance sensor 301 at least twice and the measurement result of the temperature of the distance sensor 301 at each measurement time point, the controller 51 acquires a correlation between the measurement results of the distance sensor 301 and the temperature of the distance sensor 301. Specifically, for example, as illustrated in FIG. 15, the controller 51 acquires the correlation (i.e., a correction equation) R from a distance Lt1 to the correction surface Wr1 measured by the distance sensor 301a before the scan distance measurement by the distance sensor 301a and a temperature T1 at the time of the measurement, and a distance Lt2 to the correction surface Wr1 measured by the distance sensor 301a after the scan distance measurement by the distance sensor 301a and a temperature T2 at the time of the measurement.

Then, the controller 51 corrects the measurement results of the distance to the focus ring 107 or the reference surface Ws by the distance sensor 301 at each measurement time point based on the acquired correlation and the temperature of the distance sensor 301 at each measurement time point. Specifically, for example, based on the acquired correlation R of FIG. 15 and the temperature of the distance sensor 301a at each measurement time point during the scan distance measurement, the controller 51 corrects the measurement results by the distance sensor 301a at each measurement time point during the scan distance measurement.

When the height of the focus ring 107 is calculated and estimated based on the corrected measurement results by the distance sensor 301a, the influence of the temperature change during the measurement of the distance sensor 301 can be removed.

When the temperature sensor 401 is provided and the jig wafer Wj' is used, thermal expansion of depths of the grooves in the jig wafer Wj' is very small compared to the influence of the temperature change on the measurement results by the distance sensor 301. Thus, influence of the thermal expansion on the measurement results by the distance sensor 301 is small and ignorable. However, since the temperature of the jig wafer Wj' can be estimated from a set temperature of the heater 109, the measurement results of the depths of the grooves in the jig wafer Wj' (i.e., the distances to the correction surfaces Wr1 to Wr3) by the distance sensor 301a may be corrected from the estimation results of the temperature of the jig wafer Wj'. When the height of the focus ring 107 is calculated and estimated based on the corrected measurement results by distance sensor 301a, the influence of the thermal expansion of the jig wafer Wj' can be removed.

Another Example of Annular Member

Figure 16:
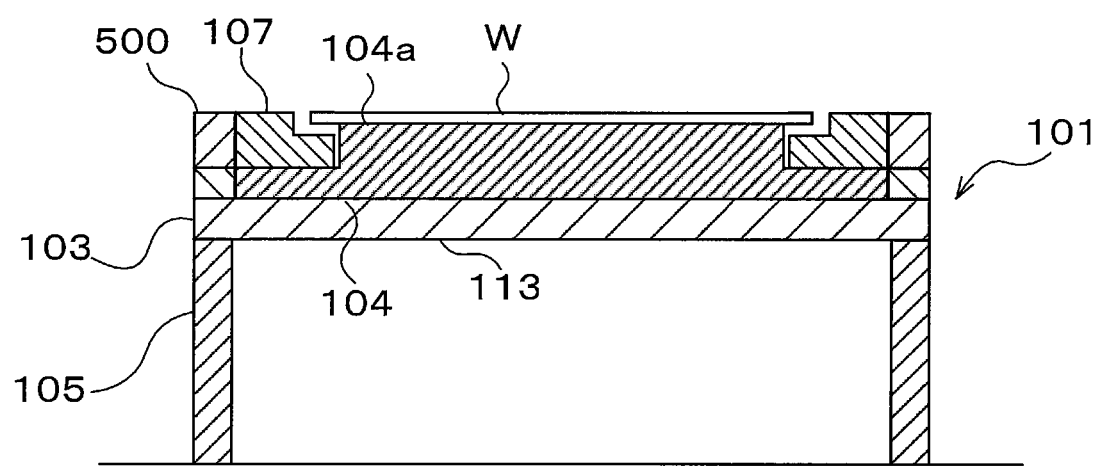
FIG. 16 is a view illustrating another example of an annular member.

FIG. 16 is a view illustrating another example of the annular member. In addition to the focus ring 107, as illustrated in FIG. 16, a cover ring 500 may be disposed on the stage 101 to cover an outer surface of the focus ring 107, as an annular member. The technique of the present disclosure is also applicable to estimate a height of the cove ring 500 placed on the stage 101.

According to the present disclosure, it is possible to accurately estimate a height of an annular member placed on a stage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system comprising:
   a substrate processing apparatus including a stage on which a substrate and an annular member disposed to surround the substrate are placed, and configured to perform a predetermined process on the substrate placed on the stage;
   a substrate transport mechanism including a substrate holder and configured to hold the substrate by the substrate holder and load and unload the substrate with respect to the substrate processing apparatus;
   a distance sensor provided in the substrate holder and configured to measure distances from the substrate holder; and
   a control device,
   wherein the substrate transport mechanism is further configured to place, on the stage on which the annular member is placed, a jig substrate having a reference surface as a reference for a height of the annular member,
   wherein the distance sensor is further configured to measure a distance from the substrate holder positioned above the stage to the reference surface of the jig substrate and a distance from the substrate holder to the annular member, and
   wherein the control device is configured to estimate the height of the annular member based on a measurement result of the distance to the reference surface and a measurement result of the distance to the annular member.

2. The substrate processing system of claim 1, wherein the distance sensor is further configured to continuously measure the distance from the substrate holder to the annular member while the substrate holder is moving above the stage such that the distance sensor moves in a crossing direction crossing the annular member in a plan view, and
   wherein the control device is further configured to estimate a height distribution of the annular member in the crossing direction based on the measurement result of the distance from the substrate holder to the reference surface and the continuous measurement result of the distance from the substrate holder to the annular member.

3. The substrate processing system of claim 2, wherein the substrate holder is provided with at least two distance sensors,
   wherein while the substrate holder is moving above the stage such that a first distance sensor of the at least two distance sensors moves in the crossing direction, the first distance sensor continuously measures the distance from the substrate holder to the annular member, and a second distance sensor of the at least two distance sensors continuously measures the distance from the substrate holder to the reference surface of the jig substrate, and
   wherein the control device is further configured to estimate the height distribution of the annular member in the crossing direction based on the measurement result of the distance from the substrate holder to the reference surface and the measurement result of the distance from the substrate holder to the annular member at each time point during the measurement by the first distance sensor and the second distance sensor.

4. The substrate processing system of claim 3, wherein the jig substrate has correction surfaces that are separated from the reference surface in a height direction, respectively, and distances from the reference surface to the correction surfaces in the height direction are different from one another,
   wherein the distance sensor is further configured to measure the distance from the substrate holder to each of the correction surfaces of the jig substrate, and
   wherein the control device is further configured to correct the measurement result by the distance sensor based on a measurement result of the distance from the substrate holder to each of the correction surfaces.

5. The substrate processing system of claim 4, further comprising a temperature sensor configured to measure a temperature of the distance sensor,
   wherein the control device is further configured to correct the measurement results by the distance sensor based on a measurement result of the temperature of the distance sensor at a time of measurement by the distance sensor.

6. The substrate processing system of claim 5, wherein the distance sensor is further configured to measure a distance from the substrate holder to a predetermined portion on the jig substrate at least twice,
   wherein the temperature sensor is further configured to measure the temperature of the distance sensor at each time point at which the distance from the substrate holder to the predetermined portion is measured by the distance sensor, and
   wherein the control device is further configured to:
      acquire, based on a measurement result obtained by measuring the distance from the substrate holder to the predetermined portion by the distance sensor at least twice and the temperature of the distance sensor at each time point of the measurement, a correlation between the measurement result by the distance sensor and the temperature of the distance sensor; and
      correct the measurement result by the distance sensor based on the temperature of the distance sensor at the time of the measurement and the correlation.

7. The substrate processing system of claim 6, wherein the annular member is at least one selected from the group of a focus ring disposed adjacent to the substrate placed on the stage and a cover ring disposed to cover an outer surface of the focus ring.

8. The substrate processing system of claim 1, wherein the jig substrate has correction surfaces that are separated from the reference surface in a height direction, respectively, and distances from the reference surface to the correction surfaces in the height direction are different from one another,
   wherein the distance sensor is further configured to measure the distance from the substrate holder to each of the correction surfaces of the jig substrate, and
   wherein the control device is further configured to correct the measurement result by the distance sensor based on a measurement result of the distance from the substrate holder to each of the correction surfaces.

9. The substrate processing system of claim 1, further comprising a temperature sensor configured to measure a temperature of the distance sensor,
   wherein the control device is further configured to correct the measurement results by the distance sensor based on a measurement result of the temperature of the distance sensor at a time of measurement by the distance sensor.

10. The substrate processing system of claim 1, wherein the annular member is at least one selected from the group of a focus ring disposed adjacent to the substrate placed on the stage and a cover ring disposed to cover an outer surface of the focus ring.

11. A method of estimating a height of an annular member in a substrate processing system, wherein the substrate processing system comprises:
   a substrate processing apparatus including a stage on which a substrate and the annular member disposed to surround the substrate are placed, and configured to perform a predetermined process on the substrate placed on the stage;
   a substrate transport mechanism including a substrate holder and configured to hold the substrate by the substrate holder and load and unload the substrate with respect to the substrate processing apparatus; and
   a distance sensor provided in the substrate holder and configured to measure distances from the substrate holder, and
   wherein the method comprises:
   placing, by the substrate transport mechanism, a jig substrate having a reference surface that serves as a reference for the height of the annular member, on the stage on which the annular member is placed;
   measuring, by the distance sensor, a distance from the substrate holder positioned above the stage to the reference surface of the jig substrate and a distance from the substrate holder to the annular member; and
   estimating the height of the annular member based on a measurement result of the distance to the reference surface and a measurement result of the distance to the annular member.

* * * * *